United States Patent [19]

Cook et al.

[11] Patent Number: 4,762,663
[45] Date of Patent: Aug. 9, 1988

[54] SELF-TESTING MONITORING CIRCUIT

[75] Inventors: Henry F. Cook, Penn Hills Twp., Allegheny County; James F. Sutherland; Ronald J. Weisner, both of Plum Boro, all of Pa.

[73] Assignee: Westinghouse Electric Corp., Pittsburgh, Pa.

[21] Appl. No.: 849,246

[22] Filed: Apr. 8, 1986

[51] Int. Cl.$^4$ .............. G21C 7/36; G01R 31/00; G08B 19/00
[52] U.S. Cl. .................. 376/259; 376/215; 324/158 R; 324/73 R; 340/644
[58] Field of Search .............. 324/73 AT, 415, 418, 324/423; 340/644; 376/256, 259, 215, 216; 371/57, 63; 307/471, 411; 246/5

[56] References Cited

U.S. PATENT DOCUMENTS 4,516,076  5/1985  Pillari et al. ............... 324/415 X
4,583,013  4/1986  Gupta ....................... 307/471 X
4,664,870  5/1987  Hager ....................... 376/215 X
4,692,298  9/1987  Coradi et al. ............... 376/259 X

FOREIGN PATENT DOCUMENTS 2440720   3/1976  Fed. Rep. of Germany .
2614748  10/1977  Fed. Rep. of Germany .
3424294   1/1986  Japan ........................ 324/415

Primary Examiner—Ernest F. Karlsen
Assistant Examiner—Vinh P. Nguyen
Attorney, Agent, or Firm—D. C. Abeles

[57] ABSTRACT

A self-testing contact closure test circuit and method in which invalid logic states are artificially created in order to simulate a switch malfunction, and thus to determine whether the testing circuitry correctly identifies the invalid state. The system is designed to be used with switches such as those incorporating form "C" arrangements having two pairs of contacts which under normal circumstances are in opposite states.

13 Claims, 5 Drawing Sheets

SELF-TESTING MONITORING CIRCUIT

FIELD OF THE INVENTION

The present invention relates to a self-testing monitoring circuit and more particularly to a self-testing monitoring circuit for a nuclear power plant, the circuit being capable of assuming artificially created fault states for testing both its own operation and the operation of additional monitoring circuitry.

BACKGROUND OF THE INVENTION

In many applications in control systems for plants, including nuclear power plants, it is desirable or even necessary to sense the status of switch contacts. The switches may be main control board push buttons or selector switches, or they may be limit switches located on motordriven actuators. In either case, it is crucial that the process control system be able to sense the switch status reliably. One measure used to enhance the reliability of such systems involves the use of paired or redundant contacts, in which a switch has at least two pairs of contacts which are always in opposite states. A switch with form "C" contacts or form "D" contacts is such a switch. In the form "C" switch, there are two pairs of switches, one of which is normally open and the other of which is normally closed. Opening one switch automatically closes the other, and vice versa. In a form "C" switch, the contacts are arranged in a "break before make" fashion; in a form "D" switch, they are arranged in a "make before break" fashion. In either case, the switch may be inferred to be malfunctioning if both pairs of contacts have the same state after a short transition time, that is, both are open or both are closed. Therefore, to test the switch reliably, it is necessary only to provide circuitry which is capable of monitoring the condition of each half of the switch, i.e., each pair of contacts, and which produces an error signal if both pairs of contacts are in the same state. In conventional circuitry, this is accomplished by providing a digital indication of the status of the pair of contacts, e.g., a "0" if the pair of contacts is opened, and a "1" is the pair of contacts is closed. The signal indicative of the state of one pair of contacts is then compared logically with that of the other pair of contacts. If the signals have the same logical value (if the parity of a signal which a combination of the two is even) the switch is detected as malfunctioning, and appropriate corrective measures may be instituted.

While such circuitry is sufficient to insure reliable operation of an overall system in many instances, it is often necessary to provide an even higher level of reliability of periodically testing the testing circuitry itself. In the past, this higher-level testing has been simply a maintenance procedure carried out on the order of once every six months or so. Again, while this periodic testing is sufficient to insure a sufficient degree of reliably in many systems, there are advantages to be achieved if testing made automatic so that it can easily be carried out more frequently and even on-line.

SUMMARY OF THE INVENTION

It is therefore an object of the present invention to provide a switch testing circuit with a self-testing capability.

It is a further object of the present invention to provide a switch testing circuit with circuitry which temporarily disconnects the testing circuitry from the switch being tested, and instead, in effect, connects it to relays which controllably mimic operation of the switch.

Additional objects, advantages, and novel features of the invention will be set forth in part in the description which follows and in part will become apparent to those skilled in the art upon examination of the following or may be learned by practice of the invention.

To achieve the foregoing and in accordance with the purposes of the invention, as embodied and broadly described herein, there is provided a self-testing circuit for monitoring operation of a switch, the switch having first and second pairs of contacts, the pairs having a contact in common, with one of the pairs being open and the other being closed unless the switch is malfunctioning. The circuit has first testing means, connected across the first pair and responsive to a first enable signal and a first select signal, for outputting, in the absence of the enable signal, an output signal having a first value if the first pair is open and a second value if the first pair is closed, and for outputting, in the presence of the first enable signal, an output signal having the first value of the second value regardless of whether the first pair is open or closed.

The circuit also has second testing means, connected across the second pair and responsive to a second enable signal and a second select signal, for outputting, in the absence of the second enable signal, an output signal having the first value if the second pair is open and the second value if the second pair is closed, and for outputting, in the presence of the second enable signal, an output signal having the first value or the second value regardless of whether the second pair is open or closed. The output signals are applied to logic means, responsive to said first and second testing means, for producing an error signal if the first and second output signals have equal values.

The testing means preferably include relays. The relays can then be used to "inject" invalid logic states into the system. If the injection of an invalid logic state fails to prompt an indication of a malfunction, it may then be inferred that the testing circuit itself is malfunctioning, and corrective measures can be taken.

The invention provides means and method for self-testing which are sufficiently simple and easy that self-testing can be carried out frequently, thus enhancing reliability.

BRIEF DESCRIPTION OF THE DRAWINGS

These and other features and advantages of the present invention will become more apparent from the following written description read in conjunction with the drawings, in which.

DETAILED DESCRIPTION OF THE PREFERRED EMBODIMENTS

Reference will now be made in detail to the presently preferred embodiments of the invention, an example of which is illustrated in the accompanying drawings.

Figure 1:
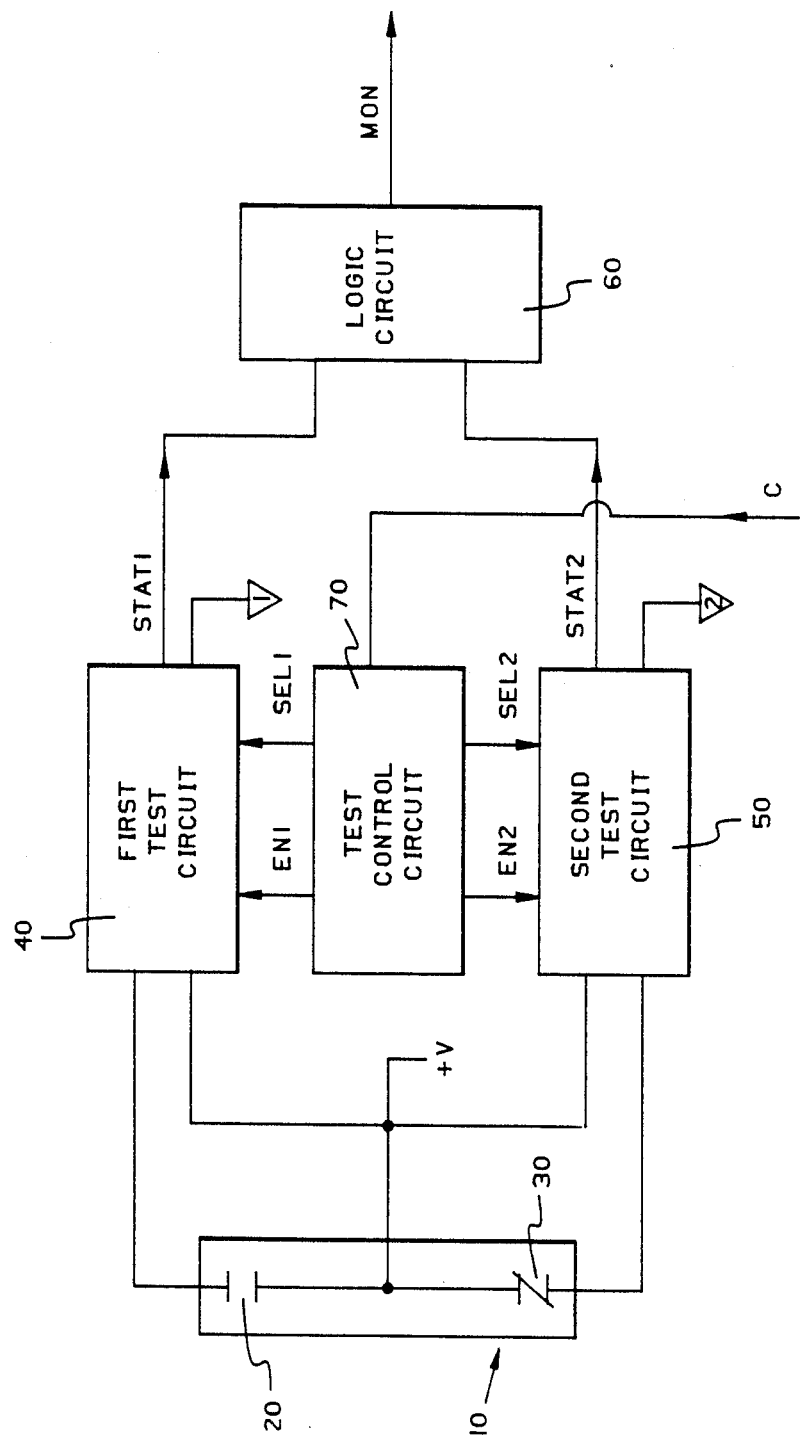
FIG. 1 is a functional block diagram of a self-testing circuit according to the invention.

FIG. 1 shows a functional block diagram of a basic circuit according to the present invention. Numeral 10 designates generally a switch having two pairs of contacts, one of which is normally open (contact pair 20 in FIG. 1), and the other of which is normally closed (contact pair 30 in FIG. 1). Connected across contact pair 20 is first test circuit 40. Similarly, connected across contact pair 30 is a second test circuit 50. First test circuit 40 is adapted to produce a first status signal STAT1 normally indicative of the state of contact pair 20. Similarly, second test circuit 50 is adapted to produce a second status signal STAT2, normally indicative of the state of contact pair 30. Since it is given that when the switch is operating properly, the contact pairs will be in opposite states, the value of STAT1 and STAT2 should never be equal if the switch is operating properly. Logic circuit 60 compares the values of STAT1 and STAT2 and produces a monitoring signal having a first value if STAT1 and STAT2 are not equal, thus indicating normal operation, and a second value if STAT1 equals STAT2, thus indicating that the switch 10 is malfunctioning.

The circuit depicted in FIG. 1 also includes a test control circuit 70. Test control circuit 70, in response to a control signal C, is capable of producing a first enable signal EN1 and a first select signal SEL1 for first test circuit 40, and a second enable signal (EN2) and a second select signal (SEL2) for second test circuit 50. Details of the construction of a circuit serving as test control circuit 70 will be readily apparent to one having ordinary skill in the art. When the enable signals have a first logical value (e.g. low) first and second test circuits 40 and 50 operate normally, i.e., the signals STAT1 and STAT2 are indicative of the actual state of contact pair 20 and 30, respectively. When the enable signals assume a second value (e.g., high), the signals STAT1 and STAT2 are no longer reflective of the condition of the contact pairs, but instead assume a value dependent on the value of the SEL1 and SEL2 signals, respectively. Thus, it is possible to "inject" forbidden logical values into the system. When the enable signals enable testing, and the select signals select the same value for STAT1 and STAT2, an error condition is artificially created. If the logic circuit does not produce a malfunction indication in response to the injection of the invalid logic state, then it may be inferred that the logic circuit is malfunctioning or that the test circuits are malfunctioning, and appropriate corrective measures may be undertaken.

Switch 10 is intended to represent a form "C" switch, but a form "D" switch, or any other switch which includes two pairs of contacts which normally have different states, may be used. If a form "D" switch is used (make before break), there is naturally a brief instant when both switches are closed. The brief existence of an invalid logic state, however, can be identified and discriminated so that it does not produce an error signal.

Also, in the foregoing discussion and the discussion which follows, it is assumed that there are separate enable and select signals generated. It will apparent to one of ordinary skill in the art, however, that the same enable and select signal could be sent to first test circuit 40 and second test circuit 50 and still provide satisfactory operation of the system.

Finally, for maximum reliability, it is desirable that each "channel" (defined by a pair of contacts) have an independent power supply. In the circuit shown in FIG. 1, two power supplies are represented by separate numerals for the triangles representing ground. The power supplies are assumed to have their high sides tied together between the pairs of contacts at +V.

Figure 2A:
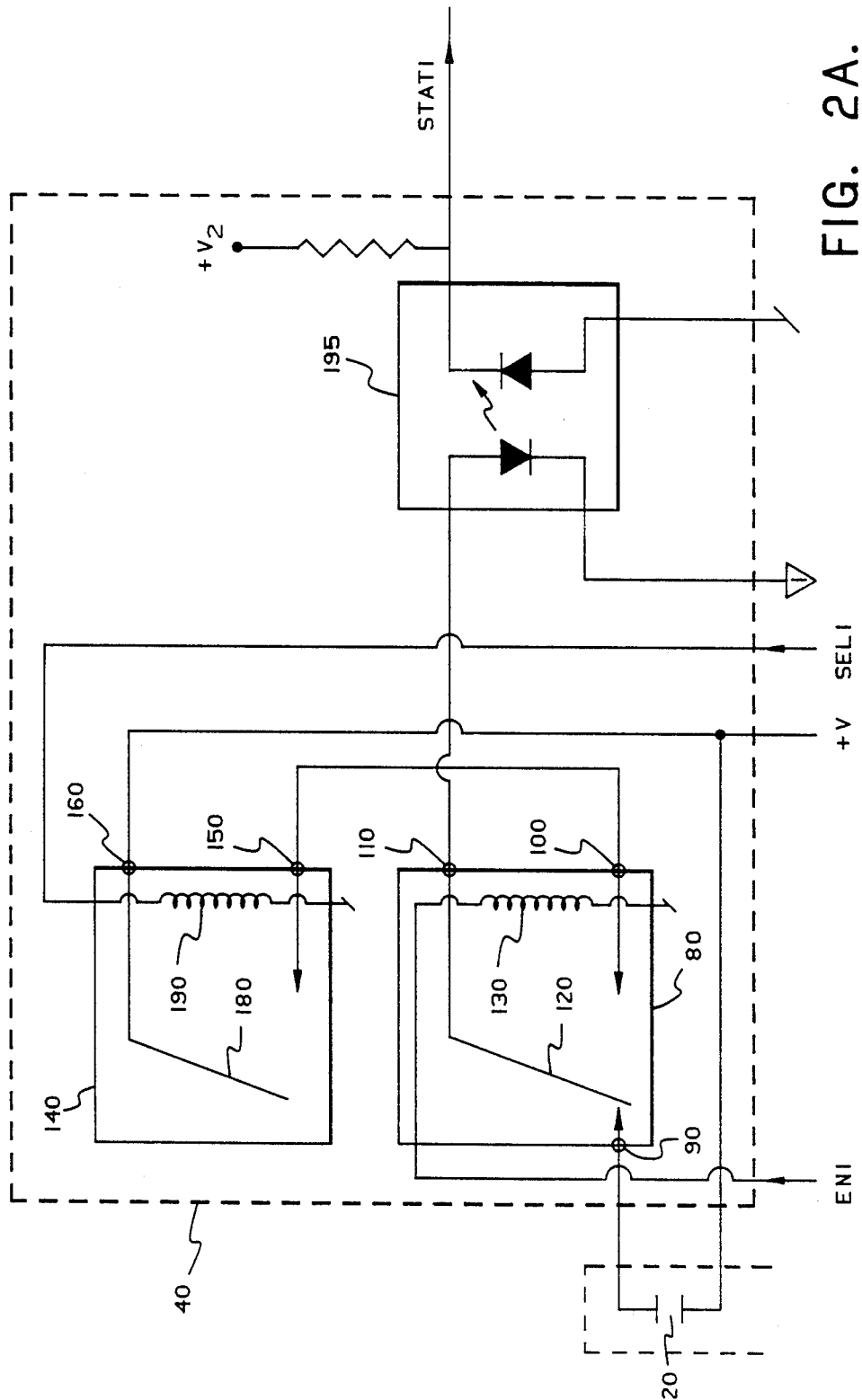
FIGS. 2A and 2B are schematic diagrams showing some details of circuitry of components of the system depicted in FIG. 1.

FIG. 2A shows a preferred circuit to serve the function of first test circuit 401. This can be seen, the circuit comprises a first relay 80 having a first terminal 90, a second terminal 100, and a third terminal 110. The first terminal 90 is connected to the contact of switch 20 which is not directly connected to the other pair of contacts 30. The third contact 110 is selectably connectable to either first terminal 90 or second terminal 100 depending on the position first relay arm 120. The position of first relay arm 120 is controlled according to whether or not a current flows first relay coil 130, a condition which is, in turn, controlled by whether EN1 is high or low (i.e., the presence or absence of EN1).

The circuit also includes a second switch or relay 140 having at least fourth terminal 150 and a fifth terminal 160. The second terminal 100 of first relay 80 is connected to fourth terminal 150 of second relay 140. The fifth terminal is connected to +V. Whether the fourth terminal, and thus the second terminal, is connected to +V is controlled by the position of second relay arm 180, which is in turn controlled by second relay coil 190. In other words, the connection between fourth terminal 150 and fifth terminal 160 will be made when current flows through coil 190, which occurs when the select signal SEL1 goes high.

Relays 80 and 140 may be any suitable relay, for example, a Teledyne 712M-112. Also, relay 140 may be replaced by a simple electromagnetic switch.

The output from third terminal 110 is used as input for optoelectronic isolation circuit 195. When terminal 110 is high (that is, when it connected to +V either through contact pair 20 or through second relay 140 in a manner which will be described below) current flows through the LED internal to optoelectronic isolation circuit 195 so that it emits light. This transmission of light renders the diode in the output side of optoelectronic isolation circuit conductive, thus rendering a low or logical 0 signal for status signal STAT1. Otherwise, the status signal STAT1 remains high.

In normal operation, the enable signal would be low, which directly connects switch 20 to the optoelectronic isolation circuit 195, so that the logical value of status signal STAT1 would be reflective of whether contact pair 20 is open or closed. When it is desired to test the circuit, on the other hand, the enable signal EN1 goes high to energize relay coil 130, thus moving relay arm 120 from contact with first terminal 90 to contact with second terminal 100. The logical value of status signal STAT1 will depend upon whether the switch defined by relay arm 180 and fourth contact 150 is open or closed. The state of the switch is controlled by the select signal SEL1. When SEL1 is low, the switch remains open, no current flows through the optoelectronic isolation circuit 195, and the STAT1 signal remains high. When the switch is closed, current flows through the light emitting diode within optoelectronic isolation circuit 195 and so the STAT1 signal becomes low. The optoelectronic isolation circuit may be any suitable circuit, for example, an HCPL-3700.

Figure 2B:
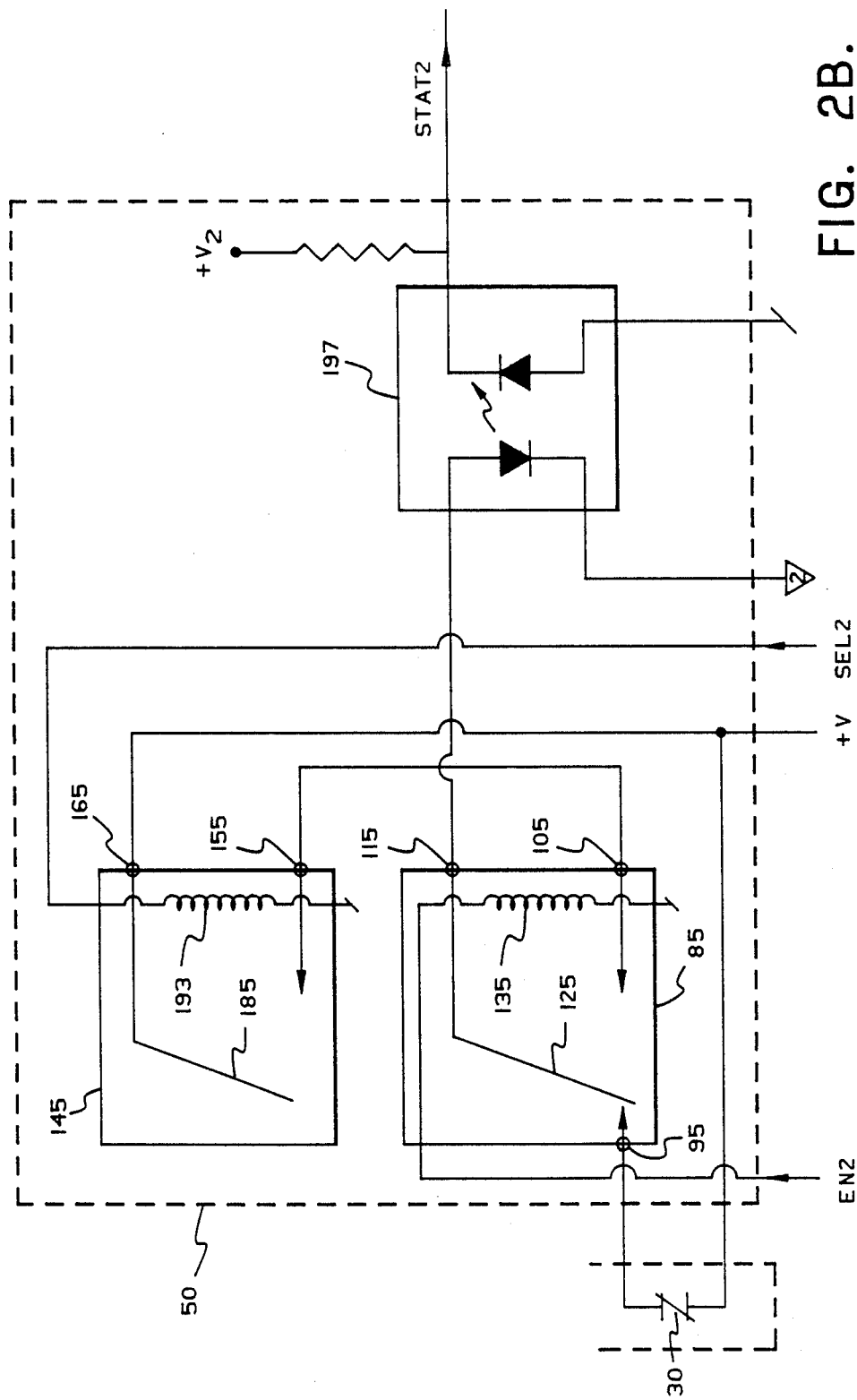

Details of construction and operation of second test circuit 502 are identical to those just described, and will be omitted here for the sake of brevity. Let it suffice to say that second test circuit 50 as shown in FIG. 2B also comprises a pair of relays 85, 145, interconnected in a fashion similar to that described above for relays 80, 140, respectively, and an optoelectronic isolation circuit 197.

With a circuit such as that just described, it is expected that periodic testing of each contact input circuit on a 4-6 week interval will be feasible. As mentioned above, a contact arrangement such as a form "C" contact arrangement offers a means in inherent error detection. Of the four possible combinations (00, 01, 10, and 11), only two are valid, and the other two are detectable as invalid. The test circuit in effect forces the inputs to assume the invalid states of 00 and 11 (those having even parity) and verify that the built-in error detection logic is working correctly. Until the next periodic test, the contact closure's input system continuously checks for valid inputs, and if a wire, connection, or switch should fail "shorted" or "open" the logic processor is programmed to take appropriate action such as reporting the fault and reverting to a safer or preferred state.

In addition to testing the continous test capability of the contact closure input logic processor, the automatic tester sets up test conditions to check the system logic from input to output. When enabled, for example, by a key switch, the auto tester can force the status of each individual contact closure input (CCI) signal to be either closed or open. It does this by outputting a logic "0" and thus causes the switch to appear to be closed. Thus, all four possible states may be injected into the system, and proper system operation may be ascertained by means of output signals which are monitored by the automatic tester via data links.

Figure 3:
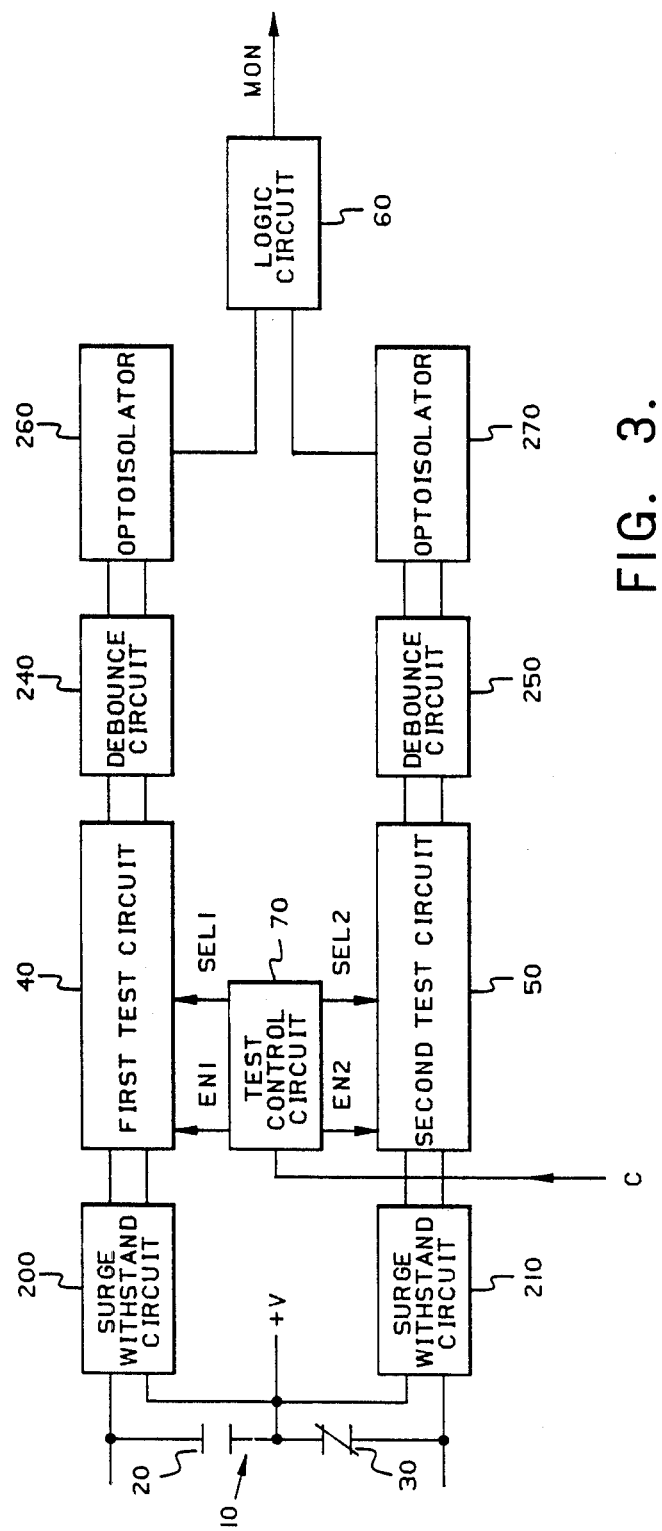
FIG. 3 is a functional block diagram of the self-testing circuit according to the present invention in an application requiring especially stringent measures for assuring reliability.

FIG. 3 shows the testable contact closure input circuit as part of an overall system such as would be used in a safety grade application such as in a nuclear power plant. In the arrangement shown in FIG. 3, surge withstand circuits 200 and 210 have been interposed between the test circuits and their respective pair of contacts. The surge withstand circuits are used to decouple the plant contacts from the test injection circuit during invalidity tests, and they also serve to limit surge withstand circuit test currents to the test circuitry. These test circuits are well known to one of ordinary skill in the art, and typically include choke coils to reject RF signals, appropriate resistor networks, and capacitor networks. Typically, they are designed to withstand up to a 3,000 volt surge.

Downstream of first test circuit 40 and second test circuit 50 are debounce circuits 240 and 250. These circuits "debounce" the signals (i.e., prevent erroneous indications of multiple depression of a switch inadvertently caused by "bounce" in the switch) by accepting a change in state only after the signal level has been stable for several consecutive samples. Such debounce circuits are well known in the art, and commercially available. For example, a Motorola MC14490 Hex Contact Bounce Eliminator would suffice in this application.

Finally, an additional pair of optoelectronic isolation circuits, 260 and 270 are interposed between the debounce circuits and the logic circuit, respectively, in order to provide an additional degree of electric isolation and to prevent any circulating currents.

Figure 4:
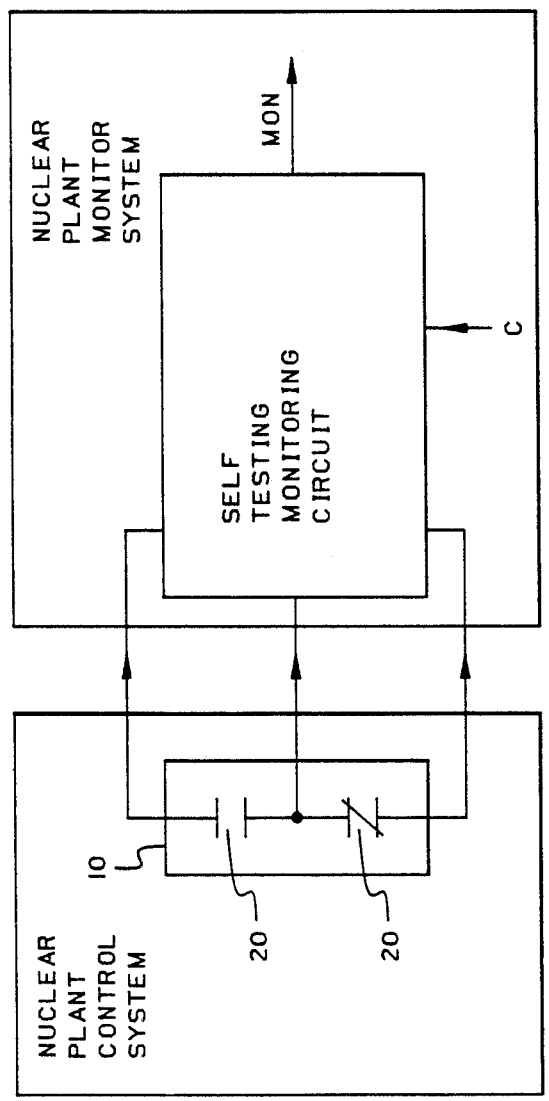
FIG. 4 is a functional block diagram of the self-testing circuit incorporated into a monitoring system of a nuclear power plant.

FIG. 4 shows the self-testing monitoring circuit incorporated into the monitoring system of a nuclear plant. Switch 10 having normally open contacts 20 and normally closed contacts 30 represents any of the multitude of such switches (e.g., form "C" or form "D") normally included in a control system panel of a nuclear reactor. The self-testing monitoring circuit connects across the contacts as previously described, and produces a monitor signal which the monitoring system uses to determine either proper operation or malfunction and response.

If will obvious to one of ordinary skill in the art that many modifications of the specific embodiments described above can be made without departing from the spirit of the invention. For example, if desired, the first and second relays may be replaced with optoelectronic isolation circuit for forcing the status outputs STAT1 and STAT2 high or low as desired. Therefore, the invention should not be regarded as being limited to the embodiments specifically described above, but instead should be regarded as being fully commensurate in scope with the following claims.

What is claimed is:

1. A self-testing circuit for monitoring operation of a switch, the switch having first and second pairs of contacts, with one of the pairs being open and the other being closed unless the switch is malfunctioning, the circuit comprising:

(a) first testing means, connected across said first pair and responsive to a first enable signal and a first select signal, for outputting, in the absence of said enable signal, a first output signal having a first value if said first pair is open and a second value if said first pair is closed, and for outputting, in the presence of said first enable signal, a first output signal having, in accordance with said first select signal, one of said first value and said second value regardless of whether said first pair is open or closed;

(b) second testing means, connected across said second pair and responsive to a second enable signal and a second select signal, for outputting, in the absence of said second enable signal, a second output signal having said first value if said second pair is open and said second value if said second pair is closed, and for outputting, in the presence of said second enable signal, a second output signal having, in accordance with said second select signal, one of said first value and said second value regardless of whether said second pair is open or closed; and (c) logic means, responsive to said first and second testing means, for producing an error signal if said first and second output signals have equal values.

2. A self-testing circuit as claimed in claim 1 wherein said first testing means comprises a first pair of relays switchable so that said first pair of contacts is connected to said logic means in the absence of said first enable signal, and said first pair of contacts is disconnected from said logic means in the presence of said first enable signal.

3. A self-testing circuit as claimed in claim 1 wherein said second testing means comprises a second pair of relays switchable to connect said second pair of contacts to said logic means in the absence of said second enable signal, and to disconnect said second pair of contacts from said logic means in the presence of said second enable signal.

4. A self-testing circuit as claimed in claim 1 further comprising first surge withstand means interposed between said first pair and said first testing means, and second surge withstand means interposed between said second pair and said second testing means, for protecting said first testing means from a surge voltage which may develop across said first pair and for protecting said second testing means from a surge voltage which may develop across said second pair.

5. A self-testing circuit as claimed in claim 2 wherein said first testing means further comprises a first optoelectronic isolation circuit interposed between said first pair of relays and said logic circuit, for electrically isolating said first pair of relays from said logic circuit.

6. A self-testing circuit as claimed in claim 3 wherein said second testing means further comprises a second optical isolation circuit interposed between said second pair of relays and said logic circuit, for electrically isolating said second pair of relays from said logic circuit.

7. A self-testing circuit as claimed in claim 1 further comprising a first debounce circuit interposed between said first testing means and said logic circuit, and a second debounce circuit interposed between said second testing means and said logic circuit, for eliminating faulty indications based on bounce in said first pair and said second pair, respectively.

8. A nuclear reactor comprising:
   (a) a control system for controlling operation of said nuclear reactor;
   (b) a monitoring system responsive to said control system for monitoring operation of said control system;
   (c) a switch connected in said control system, said switch having a first pair of contacts and a second pair of contacts, with one of the pairs being open and other being closed unless the switch is malfunctioning;
   (d) first testing means, connected in said monitoring system and further connected across said first pair and responsive to a first enable signal and a first select signal, for outputting in the absence of said first enable signal a first output signal having first value if said first pair is open and a second value if said first pair is closed, and for outputting in the presence of said first enable signal a first output signal having in accordance with said first select signal one of said first value and said second value regardless of whether said first pair is open or closed;
   (e) second testing means, connected in said monitoring system and further connected across said second pair and responsive to a second enable signal and a second select signal, for outputting in the absence of said second enable signal a second output signal having said first value if said second pair is open and said second value if said second pair is closed, and for outputting in the presence of said second enable signal a second output signal having one of said first value and said second value in accordance with said second select signal regardless of whether said second pair is open or closed; and
   (f) logic means, responsive to said first and second testing means, for producing an error signal if said first and second output signals have equal values.

9. A nuclear reactor as claimed in claim 8 wherein said switch has a form "C" contact arrangement.

10. A self-testing circuit for monitoring operation of a switch, said switch having a first pair of contacts and a second pair of contacts, with one of the pairs being open and the other being closed unless the switch is malfunctioning, the circuit comprising:
   (a) a first relay having a first terminal connected to a contact of said first pair not in common with said second pair, a second terminal, and a third terminal selectably connectable in response to a first enable signal to one of said first terminal and said second terminal;
   (b) a second relay having a fourth terminal connected to said second terminal and a fifth terminal held at a first value, said fourth terminal being selectably connectable to said fifth terminal in response to a first select signal;
   (c) a third relay having a sixth terminal connected to a contact of said second pair not in common with said first pair, a seventh terminal, and an eighth terminal selectably connectable in response to an second enable signal to one of said sixth terminal and seventh terminal;
   (d) a fourth relay having a ninth terminal connected to said seventh terminal, a tenth terminal held at a first value, said ninth terminal being selectably connectable to said tenth terminal in response to a second select signal;
   (e) a first optoelectronic isolation circuit connected to said third terminal for producing a first output signal having one of a first value if said first pair is closed and said third terminal is connected to said first terminal or said third terminal is connected to said second terminal and said fourth terminal is connected to said fifth terminal, and a second value if said first pair is open and said third terminal is connected to said first terminal or said third terminal is connected to said second terminal and said fourth terminal is not connected to said fifth terminal;
   (f) a second optoelectronic isolation circuit connected to said eighth terminal for producing a second output signal having one of (a) a first value if said second pair is closed and said eighth terminal is connected to said sixth terminal or said eighth terminal is connected to said seventh terminal and said ninth terminal is connected to said tenth terminal, and (b) a second value if said second pair is open and said eighth terminal is connected to said sixth terminal or said eighth terminal is connected to said seventh terminal and said ninth terminal is not connected to said tenth terminal; and
   (g) a logic circuit, connected to said first and second optoelectronic isolation circuits, for producing an error signal if said first and second output signals have equal values.

11. A self-testing circuit as claimed in claim 10 further comprising a first surge withstand circuit connected between said first pair of contacts and said first relay, and a second surge withstand circuit connected between said second pair of contacts and said third relay, for protecting said self-testing circuit in the event a surge voltage occurs across either said of said pairs of contacts.

12. A self-testing switching device as claimed in claim 10 wherein said switch has a form "C" contact arrangement.

13. A method of self-testing for a circuit for monitoring the status of a switch, the switch having first and second pairs of contacts, with one of the pairs being opened and other being closed unless the switch malfunctions, the circuit comprising first means connected across said first pair for producing a first indication having a first value if said first pair is open and a second value if said first pair is closed, second means connected across said second pair for producing a second indication having said first value if said second pair is open and said second value if said second pair is closed, and a logic circuit responsive to the first means and second means for producing an error signal if said first and second indications have equal values, said method comprising the concurrent steps of:

(a) disconnecting said first means from across said first pair of contacts and imposing one of said first value and said second value on said first indication regardless of whether said first pair of contacts is open or closed; and (b) disconnecting said second means from across said second pair of contacts and imposing said one of said first value and said second value on said second indication regardless of whether said second pair is open or closed, thereby deliberately creating an error condition for the logic circuit.

* * * * *